United States Patent
Choi et al.

(10) Patent No.: US 7,687,376 B2
(45) Date of Patent: Mar. 30, 2010

(54) METHOD OF MANUFACTURING VERTICAL GALLIUM NITRIDE-BASED LIGHT EMITTING DIODE

(75) Inventors: Pun Jae Choi, Gyeonggi-Do (KR); Jong Ho Lee, Seoul (KR)

(73) Assignee: Samsung Electro-Mechanics Co., Ltd., Suwon-Si, Gyunggi-Do (KR)

( * ) Notice: Subject to any disclaimer, the term of this patent is extended or adjusted under 35 U.S.C. 154(b) by 43 days.

(21) Appl. No.: 11/697,537

(22) Filed: Apr. 6, 2007

(65) Prior Publication Data
US 2007/0264733 A1 Nov. 15, 2007

(30) Foreign Application Priority Data
May 10, 2006 (KR) .................. 10-2006-0042005

(51) Int. Cl.
*H01L 21/20* (2006.01)
(52) U.S. Cl. .................. 438/478; 438/606; 438/749; 438/33; 438/572; 438/464; 438/22; 438/40; 257/79; 257/97; 257/98
(58) Field of Classification Search .................. 438/478
See application file for complete search history.

(56) References Cited

U.S. PATENT DOCUMENTS

| | | | |
|---|---|---|---|
| 4,779,280 A * | 10/1988 | Sermage et al. .......... 372/45.01 |
| 5,905,275 A * | 5/1999 | Nunoue et al. ............... 257/95 |
| 6,309,953 B1 * | 10/2001 | Fischer et al. .............. 438/606 |
| 6,551,848 B2 * | 4/2003 | Kwak et al. .................. 438/22 |
| 7,008,821 B1 * | 3/2006 | Shao et al. .................. 438/108 |
| 7,088,755 B2 * | 8/2006 | Nomura et al. .......... 372/45.01 |
| 7,190,004 B2 * | 3/2007 | Nagai et al. ................ 257/102 |
| 2002/0158259 A1 * | 10/2002 | Ono et al. ..................... 257/79 |
| 2002/0177247 A1 * | 11/2002 | Kwak et al. .................. 438/22 |
| 2003/0020061 A1 * | 1/2003 | Emerson et al. ............... 257/14 |
| 2003/0122478 A1 * | 7/2003 | Suehiro et al. .............. 313/498 |
| 2004/0051105 A1 * | 3/2004 | Tsuda et al. ................. 257/79 |
| 2004/0180470 A1 * | 9/2004 | Romano et al. ............. 438/106 |
| 2004/0206969 A1 * | 10/2004 | Orita ........................... 257/97 |
| 2005/0093008 A1 * | 5/2005 | Suehiro et al. ............... 257/98 |
| 2005/0173692 A1 * | 8/2005 | Park et al. ..................... 257/13 |
| 2005/0214965 A1 * | 9/2005 | Park et al. ..................... 438/33 |
| 2006/0094139 A1 * | 5/2006 | Chen et al. .................... 438/22 |
| 2006/0125060 A1 * | 6/2006 | Oyu ........................... 257/620 |

(Continued)

FOREIGN PATENT DOCUMENTS

KR 10-2004-0014878 A 2/2004

*Primary Examiner*—Fernando L Toledo
*Assistant Examiner*—Ankush k Singal
(74) *Attorney, Agent, or Firm*—Lowe Hauptman Ham & Berner

(57) ABSTRACT

A method of manufacturing a vertical GaN-based LED comprises preparing an n-type GaN substrate; sequentially forming an active layer and a p-type nitride semiconductor layer on the n-type GaN substrate through an epitaxial growth method; forming a p-electrode on the p-type nitride semiconductor layer; wet-etching the lower surface of the n-type GaN substrate so as to reduce the thickness of the n-type GaN substrate; forming a flat n-type bonding pad on the wet-etched lower surface of the n-type GaN substrate, the n-type bonding pad defining an n-electrode formation region; and forming an n-electrode on the n-type bonding pad.

8 Claims, 3 Drawing Sheets

U.S. PATENT DOCUMENTS

| | | | |
|---|---|---|---|
| 2006/0237732 A1* | 10/2006 | Nagai et al. | 257/91 |
| 2006/0244001 A1* | 11/2006 | Lee et al. | 257/103 |
| 2006/0278864 A1* | 12/2006 | Nagai et al. | 257/13 |
| 2007/0029541 A1* | 2/2007 | Xin et al. | 257/14 |
| 2007/0077668 A1* | 4/2007 | Kim | 438/22 |
| 2007/0131967 A1* | 6/2007 | Kawaguchi et al. | 257/190 |
| 2007/0172973 A1* | 7/2007 | Yoo | 438/28 |
| 2007/0292659 A1* | 12/2007 | Li et al. | 428/141 |
| 2008/0029789 A1* | 2/2008 | Saxler | 257/243 |

\* cited by examiner

[FIG. 1]
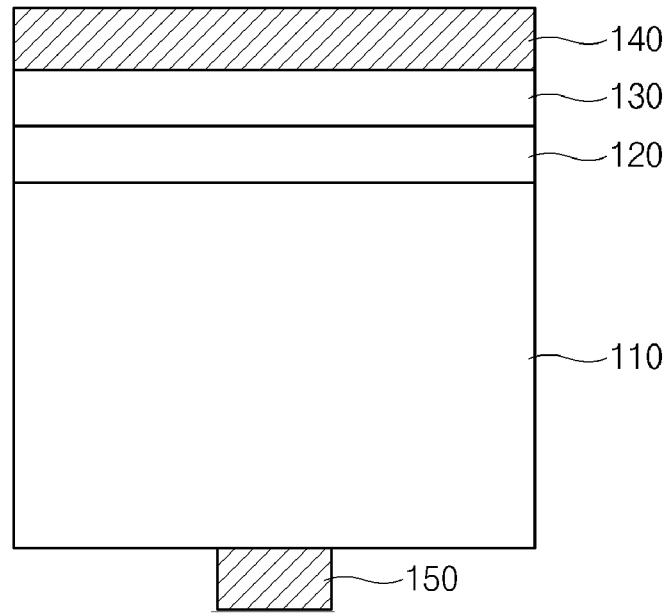
[FIG. 2A]
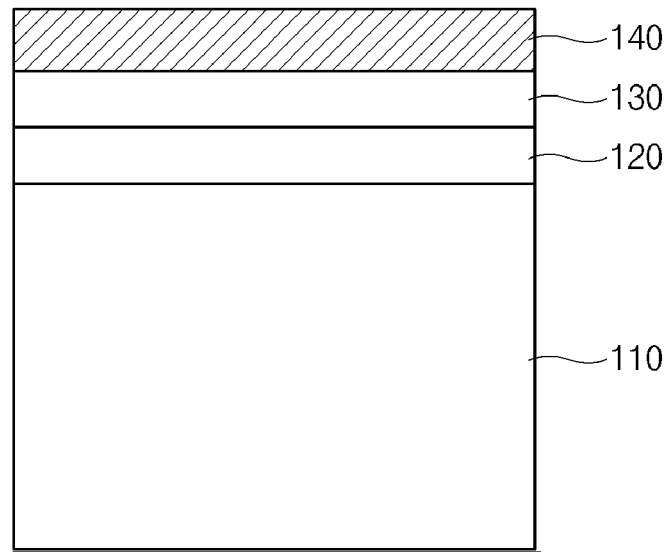
[FIG. 2B]
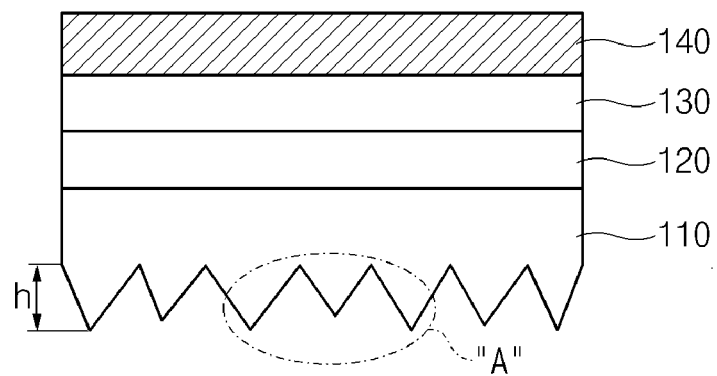

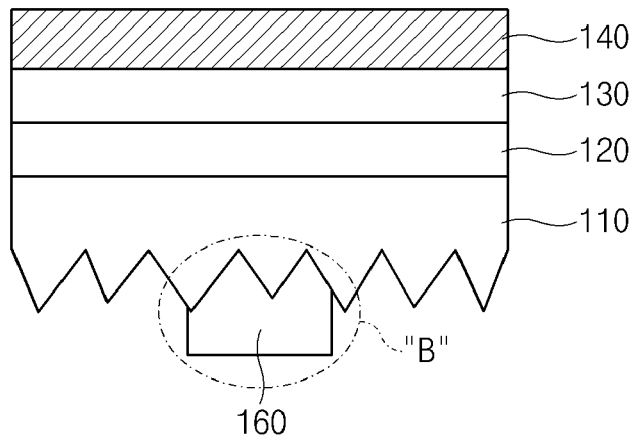
[FIG. 2C]
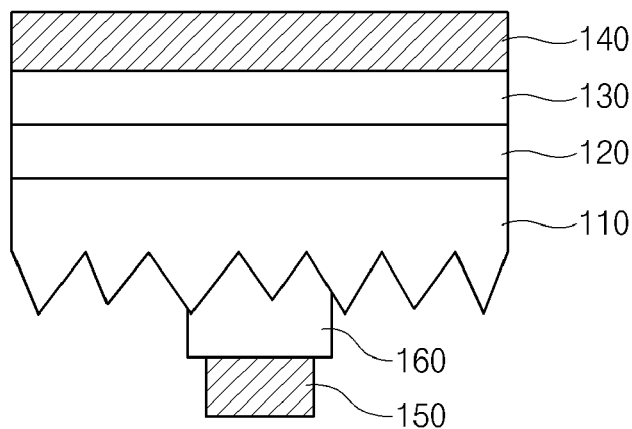
[FIG. 2D]
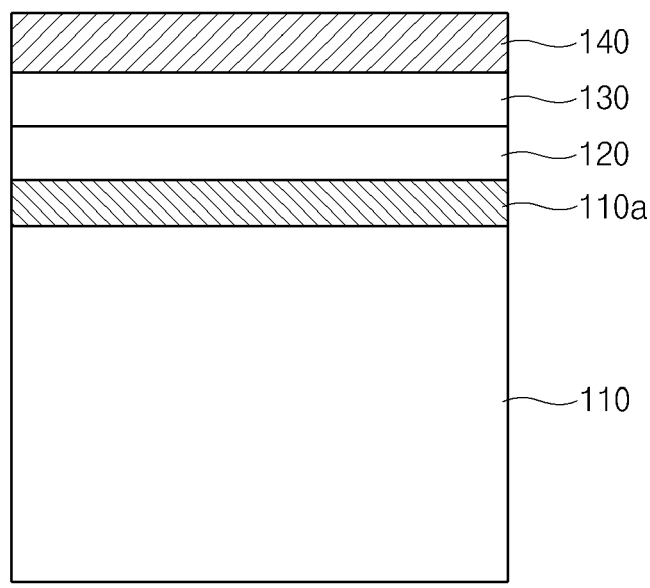
[FIG. 3]

[FIG. 4]
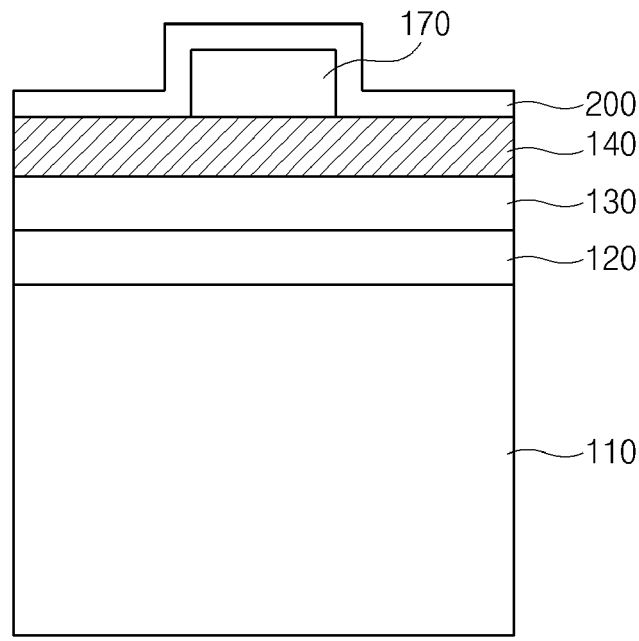
[FIG. 5]
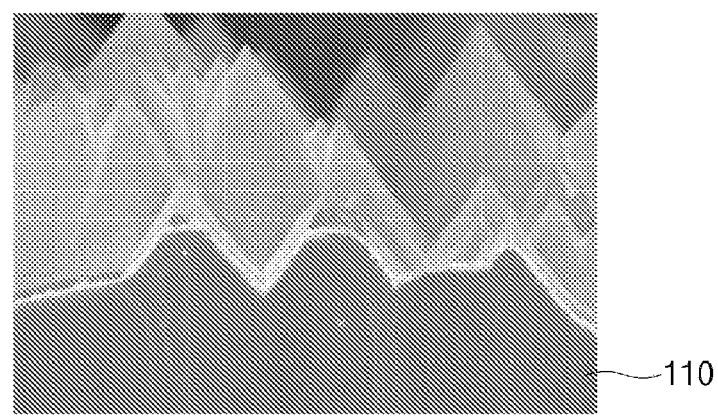
[FIG. 6]
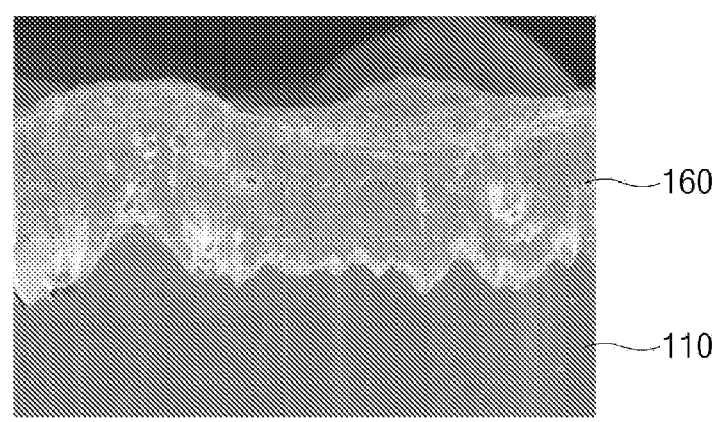

METHOD OF MANUFACTURING VERTICAL GALLIUM NITRIDE-BASED LIGHT EMITTING DIODE

CROSS-REFERENCE TO RELATED APPLICATIONS

This application claims the benefit of Korean Patent Application No 10-2006-0042005 filed with the Korean Intellectual Property Office on May 10, 2006, the disclosure of which is incorporated herein by reference.

BACKGROUND OF THE INVENTION

1. Field of the Invention

The present invention relates to a method of manufacturing a vertical (vertical-electrode-type) gallium nitride-based light emitting diode (hereinafter, referred to as 'vertical GaN-based LED') which can enhance light extraction efficiency of a vertical GaN-based LED using a GaN substrate.

2. Description of the Related Art

Generally, a GaN-based semiconductor LED is grown on a sapphire substrate, but the sapphire substrate is a rigid nonconductor and has poor thermal conductivity. Therefore, there is a limitation in reducing the manufacturing costs by decreasing the size of a GaN-based semiconductor LED, or improving the optical output power and chip characteristic. Particularly, because the application of a high current is essential for achieving high power LED, it is important to solve a heat-sink problem of the LED. To solve this problem, there has been proposed a vertical GaN-based LED using a GaN substrate with excellent conductivity and transmittance.

Now, the problems of a conventional GaN-based LED will be described in detail with reference to FIG. 1.

FIG. 1 is a sectional view for explaining the conventional GaN-based LED.

As shown in FIG. 1, the vertical GaN-based LED includes an n-type GaN substrate 110, an active layer 120, and a p-type nitride semiconductor layer 130, which are sequentially formed on the n-GaN substrate 110, thereby forming a light-emission structure. The n-type GaN substrate 110 is formed to have a large thickness such that the active layer 120 and the p-type nitride semiconductor layer 130 are epitaxially grown thereon and are supported thereby.

On and under the light-emission structure, that is, on the p-type nitride semiconductor layer 130 and under the n-type GaN substrate 110, a positive electrode (p-electrode) 140 and a negative electrode (n-electrode) 150 are respectively formed.

More specifically, in the conventional vertical GaN-based LED, the GaN substrate with excellent conductivity and transmittance is used, instead of a sapphire substrate which is a rigid nonconductor and has poor thermal conductivity. Therefore, when nitride semiconductor layers such as the active layer 120 and the p-type nitride semiconductor layer 130 are formed on the GaN substrate, a lattice defect due to growth can be minimized by the same lattice shape. Further, it is possible to solve a heat-sink problem followed by high power.

However, in the conventional vertical GaN-based LED, the GaN substrate 110 is formed to have a considerably large thickness such that a plurality of nitride semiconductor layers having the same lattice are formed on the GaN substrate 110 through an epitaxial growth method.

In such a case, when the GaN substrate 110 has a large thickness, light emitted from the active layer is absorbed into or diffused throughout the GaN substrate, while passing through the GaN substrate with a large thickness. Therefore, light extraction efficiency decreases so that the overall luminance of the vertical GaN-based LED decreases.

SUMMARY OF THE INVENTION

An advantage of the present invention is that it provides a method of manufacturing a vertical GaN-based LED, which can minimize the thickness of a GaN substrate so as to enhance light extraction efficiency of an LED.

Additional aspect and advantages of the present general inventive concept will be set forth in part in the description which follows and, in part, will be obvious from the description, or may be learned by practice of the general inventive concept.

According to an aspect of the invention, a method of manufacturing a vertical GaN-based LED comprises preparing an n-type GaN substrate; sequentially forming an active layer and a p-type nitride semiconductor layer on the n-type GaN substrate through an epitaxial growth method; forming a p-electrode on the p-type nitride semiconductor layer; wet-etching the lower surface of the n-type GaN substrate so as to reduce the thickness of the n-type GaN substrate; forming a flat n-type bonding pad on the wet-etched lower surface of the n-type GaN substrate, the n-type bonding pad defining an n-electrode formation region; and forming an n-electrode on the n-type bonding pad.

According to another aspect of the invention, the wet-etching of the n-type GaN substrate is performed so that surface irregularities are formed on the lower surface of the n-type GaN substrate.

According to a further aspect of the invention, the surface irregularities are formed to have a height of more than 1 μm.

According to a still further aspect of the invention, the wet-etching of the n-type GaN substrate is performed by any one selected from the group consisting of a chemical wet etching method, an electro-chemical wet etching method, and an optical chemical wet etching method or may be performed by a combination of more than two wet etching methods.

According to a still further aspect of the invention, the wet-etching is performed by using an etching solution such as KOH or $H_3PO_4$ solution.

According to a still further aspect of the invention, the wet-etching is performed by using an etching solution having temperature of more than 50° C.

According to a still further aspect of the invention, the method further comprises forming an n-type nitride semiconductor layer before the forming of the active layer.

According to a still further aspect of the invention, the method further comprises forming a p-type bonding pad on the p-electrode and forming a substrate support layer on the resulting structure in which the p-type bonding pad is formed, before the wet-etching of the n-type GaN substrate.

According to a still further aspect of the invention, the substrate support layer is formed by using a plating method.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view for explaining a conventional GaN-based LED;

FIGS. 2A to 2D are sectional views sequentially showing a process for explaining a method of manufacturing a vertical GaN-based LED according to an embodiment of the invention;

FIG. 3 is a sectional view showing a process for explaining a modification of the method of manufacturing a vertical GaN-based LED according to the embodiment of the invention;

FIG. 4 is a sectional view showing a process for explaining another modification of the method of manufacturing a vertical GaN-based LED according to the embodiment of the invention;

FIG. 5 is a photograph for explaining the sectional view shown in FIG. 2B in more detail; and FIG. 6 is a photograph for explaining the sectional view shown in FIG. 2C in more detail.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a method of manufacturing a vertical GaN-based LED according to an embodiment of the present invention will be described in detail with reference to the accompanying drawings.

First, the method of manufacturing a vertical GaN-based LED will be described with reference to FIGS. 2A to 2D.

FIGS. 2A to 2D are sectional views sequentially showing a process for explaining the method of manufacturing a vertical GaN-based LED.

As shown in FIG. 2A, a n-type GaN substrate 110 is prepared, which has a lattice constant close to the lattice constant of a GaN-based semiconductor. The n-type GaN substrate 110 is formed to have a large thickness such that a plurality of nitride semiconductor layers are epitaxially grown thereon in a subsequent process and are supported thereby. The n-type GaN substrate 110 according to this embodiment has a thickness of 150 µm to 300 µm.

Then, an active layer 120 and a p-type nitride semiconductor layer 130 are sequentially formed on the surface of the n-type GaN substrate 110 through an epitaxial growth process. At this time, the active layer 120 and the p-type nitride semiconductor layer 130 are formed of GaN-based semiconductor materials having a compositional formula of $Al_YIn_XGa_{1-X-Y}N$ ($0 \leq X \leq 1$, $0 \leq Y \leq 1$, $0 \leq X+Y \leq 1$), the GaN-based semiconductor materials having the same lattice shape as the n-type GaN substrate 110. In the present invention, lattice defects among the n-type GaN substrate 110, the active layer 120, and the p-type nitride semiconductor layer 130, caused by the epitaxial growth process, can be minimized so that the respective layers have excellent crystallinity. The active layer 120 can be formed with a single quantum well structure or double-hetero structure, depending on a characteristic of an LED and a process condition.

In this embodiment, before the active layer 120 and the p-type nitride semiconductor layer 130 are formed on the n-type GaN substrate 110 (refer to FIG. 2A), an n-type nitride semiconductor layer 110a having the same lattice shape as the n-type GaN substrate 110 may be formed on the n-type GaN substrate 110, as shown in FIG. 3. Then, the doping concentration of the n-type GaN substrate 110, which is low, is increased so that a current spreading effect can be enhanced. FIG. 3 is a sectional view showing a process for explaining a modification of the method of manufacturing a vertical GaN-based LED according to an embodiment of the invention.

FIG. 3 illustrates such a structure that the single-layer n-type semiconductor layer 110a is inserted between the n-type GaN substrate 110 and the active layer 120. Without being limited to the n-type nitride semiconductor layer 110a, however, single-layer or multi-layer nitride semiconductor layer such as a superlattice layer or the like can be inserted.

Then, a p-electrode 140 is formed on the p-type nitride semiconductor layer 130. The p-type nitride semiconductor layer 130 has poorer conductivity than the n-type GaN substrate 110 or the n-type nitride semiconductor layer 110a. Further, the p-type nitride semiconductor layer 130 is formed to have a thickness of less than 1 µm and has a characteristic close to the PN junction. Therefore, in consideration of electrical and thermal characteristics, it is preferable that an ohmic characteristic and an optical reflection characteristic are provided on the entire upper surface of the p-type nitride semiconductor layer 130. In other words, the p-type electrode 140 may be composed of a single layer formed of metal having an ohmic characteristic and an optical reflection characteristic or may be formed by sequentially laminating metals having an ohmic characteristic and an optical reflection characteristic, respectively.

Continuously, as shown in FIG. 2B, the lower surface of the n-type GaN substrate 110 is etched so as to reduce the thickness of the n-type GaN substrate 110. At this time, the etching process for reducing the thickness of the n-type GaN substrate 110 may be performed by any one selected from the group consisting of a chemical wet etching method, an electro-chemical wet etching method, and an optical chemical wet etching method or may be performed by a combination of more than two wet etching methods.

As described above, the thickness of the n-type GaN substrate 110 is reduced by the wet etching. Therefore, the manufacturing process is easily performed, so that mass production can be achieved.

Particularly, when the lower surface of the n-type GaN substrate 110 is wet-etched so as to reduce the thickness of the n-type GaN substrate 110, surface irregularities indicated by a portion "A" of FIG. 5 are formed on the etched surface of the n-type GaN substrate 110, that is, the lower surface of the GaN substrate 110.

FIG. 5 is a photograph for explaining the sectional view shown in FIG. 2B in more detail.

When light is emitted from the n-type GaN substrate 110 as a dense medium into a vacuum as a less dense medium, the surface irregularities increases a critical angle of light incident on the interface between two mediums such that a probability of total reflection on the interface can be minimized. Therefore, it is preferable that the surface irregularities are formed to have a height of more than 1 µm such that a critical angle of light incident on the interface between the n-type GaN substrate 110 and the vacuum increases.

In this embodiment, in order to form surface irregularities having a height of more than 1 µm, an etching solution such as KOH or $H_3PO_4$ is used on performing the wet-etching process. Preferably, such an etching solution has temperature of more than 50° C. If the temperature of the etching solution decreases to less than 50° C., an etch rate decreases so that surface irregularities cannot have a height of more than 1 µm.

Further, the surface irregularities having a height of more than 1 µm serve to help mold to come in uniform contact in the subsequent packaging process.

Meanwhile, before the wet-etching process for reducing the thickness of the n-type GaN substrate 110, a p-type bonding pad 170 and a structure support layer 200 are sequentially formed on the p-electrode 140, as shown in FIG. 4. Then, when the wet-etching is performed, the structure of the active layer 120, the p-type nitride semiconductor layer 130 and the like, formed on the n-type GaN substrate 110, can be prevented from being collapsed due to the reduced thickness of the n-type GaN substrate 110.

FIG. 4 is a sectional view showing a process for explaining another modification of the method of manufacturing a vertical GaN-based LED according to the embodiment of the invention.

As shown in FIG. 2C, a flat n-type bonding pad 160 for defining an n-electrode formation region is formed on the surface of the n-type GaN substrate 110 where the surface irregularities are formed. At this time, since the n-type bonding pad 160 is formed on the lower surface of the n-type GaN substrate 110 where the surface irregularities are formed, a plating method is preferably used so as to flatten the n-type bonding pad 160. FIG. 6 is a photograph for explaining the sectional view shown in FIG. 2C in more detail, showing a state where Au is plated on the n-type GaN substrate 110 having surface irregularities by a plating method such that the n-type bonding pad 160 is formed.

The n-type bonding pad 160 formed in such a manner serves to facilitate the subsequent bonding process, because an n-electrode to be formed thereon can be flattened.

Subsequently, as shown in FIG. 2D, an n-electrode 150 composed of metal having an ohmic characteristic is formed on the n-type bonding pad 160.

Next, the subsequent processes such a bonding process, a packaging process, and the like are performed in accordance with a typical method of manufacturing a vertical GaN-based LED.

According to the present invention, the lower surface of the n-type GaN substrate is wet-etched by a predetermined thickness such that the thickness of the n-type GaN substrate can be minimized, and simultaneously, the surface irregularities having a height of more than 1 μm can be formed. Therefore, it is possible to enhance light extraction efficiency of the LED.

Further, the flat n-type bonding pad is formed on the surface of the n-type GaN substrate having the surface irregularities formed thereon, thereby preventing defective bonding of the n-electrode to be formed on the n-type bonding pad.

Therefore, it is possible to enhance light extraction efficiency of a vertical GaN-based LED and to increase an overall production yield of LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical GaN-based LED comprising:
    preparing an n-type GaN substrate;
    sequentially forming an active layer and a p-type nitride semiconductor layer on the n-type GaN substrate through an epitaxial growth method;
    forming a p-electrode on the p-type nitride semiconductor layer;
    forming a p-type bonding pad on the p-electrode and forming a substrate support layer on the resulting structure in which the p-type bonding pad is formed, before the wet-etching of the n-type GaN substrate;
    wet-etching the lower surface of the n-type GaN substrate so as to reduce the thickness of the n-type GaN substrate;
    forming a flat n-type bonding pad on the wet-etched lower surface of the n-type GaN substrate, the n-type bonding pad defining an n-electrode formation region; and
    forming an n-electrode on the n-type bonding pad;
    wherein the active layer and the p-type nitride semiconductor layer have a lattice constant close to the lattice constant of the n-type GaN substrate: and
    wherein forming the n-type bonding pad includes a plating method.

2. The method according to claim 1,
    wherein the wet-etching of the n-type GaN substrate is performed so that surface irregularities are formed on the lower surface of the n-type GaN substrate.

3. The method according to claim 1 further comprising forming an n-type nitride semiconductor layer before the forming of the active layer.

4. The method according to claim 1, wherein the substrate support layer is formed by using a plating method.

5. The method according to claim 2,
    wherein the surface irregularities are formed to have a height of more than 1 μm.

6. The method according to claim 2,
    wherein the wet-etching of the n-type GaN substrate is performed by any one selected from the group consisting of a chemical wet etching method, an electro-chemical wet etching method, and an optical chemical wet etching method or may be performed by a combination of more than two wet etching methods.

7. The method according to claim 6, wherein the wet-etching is performed by using an etching solution such as KOH or $H_3PO_4$ solution.

8. The method according to claim 7,
    wherein the wet etching is performed by using an etching solution having temperature of more than 50° C.

* * * * *